United States Patent
Cullinan et al.

(10) Patent No.: US 11,228,294 B2
(45) Date of Patent: Jan. 18, 2022

(54) GRAPHENE MICROELECTROMECHANICAL SYSTEM (MEMS) RESONANT GAS SENSOR

(71) Applicant: BOARD OF REGENTS, THE UNIVERSITY OF TEXAS SYSTEM, Austin, TX (US)

(72) Inventors: Michael Cullinan, Austin, TX (US); Joon-Hyung Cho, Austin, TX (US); David Cayll, Sugarland, TX (US); Ian Seth Ladner, Picayune, MS (US)

(73) Assignee: BOARD OF REGENTS, THE UNIVERSITY OF TEXAS SYSTEM, Austin, TX (US)

( * ) Notice: Subject to any disclaimer, the term of this patent is extended or adjusted under 35 U.S.C. 154(b) by 0 days.

(21) Appl. No.: 16/651,098

(22) PCT Filed: Sep. 26, 2018

(86) PCT No.: PCT/US2018/052773
§ 371 (c)(1),
(2) Date: Mar. 26, 2020

(87) PCT Pub. No.: WO2019/067488
PCT Pub. Date: Apr. 4, 2019

(65) Prior Publication Data
US 2020/0244243 A1  Jul. 30, 2020

Related U.S. Application Data

(60) Provisional application No. 62/563,389, filed on Sep. 26, 2017.

(51) Int. Cl.
*H03H 3/00* (2006.01)
*H03H 3/007* (2006.01)
(Continued)

(52) U.S. Cl.
CPC ............ *H03H 3/0073* (2013.01); *B81B 7/02* (2013.01); *C01B 32/194* (2017.08); *G01N 29/022* (2013.01); *C01B 2204/04* (2013.01)

(58) Field of Classification Search
CPC ............ C01B 2204/04; C01B 32/194; G01N 29/022; G01N 29/036; G01N 29/22; H03H 3/0073; H03H 9/2463; B81B 7/02
See application file for complete search history.

(56) References Cited

U.S. PATENT DOCUMENTS 8,554,022 B1 * 10/2013 Hochberg ............. H01L 31/028
                                                           385/1
2002/0167374 A1 * 11/2002 Hunt ....................... B82Y 30/00
                                                          333/186
(Continued)

FOREIGN PATENT DOCUMENTS

CN       102315831 A    1/2012
WO       2015083073 A1  6/2015

OTHER PUBLICATIONS

Cho et al., "A Method to Manufacture Repeatable Graphene-Based NEMS Devices at the Wafer—Scale". Jun. 27-Jul. 1, 2016, ASME 2016 11th International Manufacturing Science and Engineering Conference, vol. 1: Blacksburg Virginia, USA. http;//proceedings. asmedigitalcollectiors.asrrie.org (Year: 2016).*

(Continued)

*Primary Examiner* — Francis C Gray
(74) *Attorney, Agent, or Firm* — Meunier Carlin & Curfman LLC (57) ABSTRACT

A method of manufacturing a nanoelectromechanical resonator allows for uniform tuning of a resonant frequency. The nanoelectromechanical resonator can be mass produced and used to sense the presence of a selected gas.

5 Claims, 9 Drawing Sheets

(51) Int. Cl.
  *C01B 32/194* (2017.01)
  *B81B 7/02* (2006.01)
  *G01N 29/02* (2006.01)

(56) References Cited

U.S. PATENT DOCUMENTS

| | | | | |
|---|---|---|---|---|
| 2010/0127312 | A1* | 5/2010 | Grebel | H01L 29/78684 257/288 |
| 2013/0214875 | A1 | 8/2013 | Duncan et al. | |
| 2014/0193574 | A1* | 7/2014 | Yeh | C01B 32/186 427/122 |
| 2017/0025998 | A1* | 1/2017 | Chen | H03B 5/30 |

OTHER PUBLICATIONS

International Search Report and Written Opinion in PCT/US2018/052773, dated Feb. 11, 2019. 10 pages.

Cho et al., "A Method to Manufacture Repeatible Graphene-Based NEMS Devices at the Wafer 1-4, 7-10-Scale." ASME 2016 11th International Manufacturing Science and Engineering Conference, vol. 1: Processing Blacksburg, Virginia, USA, Jun. 27-Jul. 1, 2016 (2016), Abstract; p. 3 col. 1; p. 5 col. 1; Fig. 2; Fig. 3.

Mina et al., "Single Layer Graphene Sheet-based Nanoelectromechanical Resonator as Mass 1-4, 7-10 Detection." J. Laser Opt. Photonics 2: 125. (Dec. 5, 2015), Entire Document.

Bunch et al., "Electromechanical Resonators from Graphene Sheets." Science Jan. 26, 2007, 1-4, 7-10 315(5811), 490-493, Entire Document.

\* cited by examiner

GRAPHENE MICROELECTROMECHANICAL SYSTEM (MEMS) RESONANT GAS SENSOR

CROSS REFERENCE TO RELATED APPLICATIONS

This application claims priority to and is a United States National Phase Patent Application of International Patent Application Number PCT/US2018/052773, filed on Sep. 26, 2018, which claims priority to U.S. Patent Application No. 62/563,389, filed on Sep. 26, 2017, both of which are incorporated by reference herein.

FIELD

Embodiments described herein relate to microelectricalmechanical system (MEMS) sensor, specifically a strain-based tunable graphene nanoelctromechanical resonator.

BACKGROUND

There are present technologies that use functionalized graphene as a solid-state gas sensor. These technologies are generally not accurate to single molecule sensing. Existing graphene resonators have high Q factors (i.e., are highly undamped) and large variations in resonant frequency from device to device.

In addition, current sensors that utilize graphene's unique qualities are usually fabricated using a "one off" method, or one at a time.

BRIEF SUMMARY

Accordingly, the present disclosure is directed to a strain-based tunable graphene nanoelctromechanical resonator that obviates one or more of the problems due to limitations and disadvantages of the related art.

In accordance with the purpose(s) of this disclosure, as embodied and broadly described herein, this disclosure, in one aspect, relates to a nanoelctromechanical resonator comprising a substrate; a first insulator on the substrate; a gate pattern on the first insulator; a second insulator over the first insulator and the gate pattern; a first stage and a second stage suspended above the second insulator and in capacitive contact with the fixed gate pattern, the first stage connected to a first set of flexural bearings and the second stage connected to a second set of flexural bearings, further comprising a thermal actuator in operative contact with the first stage for controlling location of the first stage; and a graphene sheet suspended between the first stage and the second stage; and a first electrode above the first stage and a second electrode above the second stage such that the graphene sheet is between the first electrode and the first stage on a first edge and between the second electrode and the second stage on a second edge.

In another aspect, the disclosure relates to a method of manufacturing a nanoelctromechanical resonator, comprising providing a doped silicon substrate; Depositing a first low stress nitride layer; providing a first polysilicon layer on the first low stress nitride layer; patterning the polysilicon layer to form a first patterned polysilicon layer; providing an insulating layer on the patterned polysilicon layer; patterning the insulating layer to form a patterned insulating layer; providing a second polysilicon layer on the patterned insulating layer; patterning the second polysilicon layer to form a second patterned polysilicon layer; depositing a second low stress nitride layer on the second patterned polysilicon layer; patterning the second low stress nitride layer to form a patterned low stress nitride layer.

In another aspect, a gas sensor comprises at least one nanoelectromechanical resonator, the nanoelectromechanical resonator comprising a substrate; a first insulator on the substrate; a gate pattern on the first insulator; a second insulator over the first insulator and the gate pattern; a first stage and a second stage suspended above the second insulator and in capacitive contact with the fixed gate pattern, the first stage connected to a first set of flexural bearings and the second stage connected to a second set of flexural bearings, further comprising a thermal actuator in operative contact with the first stage for controlling location of the first stage; and a graphene sheet suspended between the first stage and the second stage; and a first electrode above the first stage and a second electrode above the second stage such that the graphene sheet is between the first electrode and the first stage on a first edge and between the second electrode and the second stage on a second edge.

In another aspect, a method of sensing a selected gas, comprises providing a resonator having a graphene sheet 1-3 atoms thick, wherein the sheet of graphene has been functionalized to bond to molecules of the selected gas; tuning a resonant frequency of the graphene sheet; and detecting change in resonant frequency of the graphene sheet as indication that the selected gas is present.

Additional advantages of the disclosed device will be set forth in part in the description which follows, and in part will be obvious from the description, or may be learned by practice of the disclosed device and methods. The advantages will be realized and attained by means of the elements and combinations particularly pointed out in the appended claims. It is to be understood that both the foregoing general description and the following detailed description are exemplary and explanatory only and are not restrictive of the invention, as claimed.

Further embodiments, features, and advantages of the strain-based tunable graphene nanoelctromechanical resonator, as well as the structure and operation of the various embodiments of the strain-based tunable graphene nanoelctromechanical resonator, are described in detail below with reference to the accompanying drawings.

It is to be understood that both the foregoing general description and the following detailed description are exemplary and explanatory only, and are not restrictive of the invention as claimed.

BRIEF DESCRIPTION OF THE DRAWINGS

The accompanying figures, which are incorporated herein and form part of the specification, illustrate a strain-based tunable graphene nanoelctromechanical resonator. Together with the description, the figures further serve to explain the principles of the strain-based tunable graphene nanoelctromechanical resonator described herein and thereby enable a person skilled in the pertinent art to make and use the strain-based tunable graphene nanoelctromechanical resonator.

FIG. 7 (b) illustrates an exemplary resonance driver circuit according to principles of the present disclosure.

DETAILED DESCRIPTION

Reference will now be made in detail to embodiments of the strain-based tunable graphene nanoelctromechanical (NEMS) resonator with reference to the accompanying figures, in which like reference numerals indicate like elements.

The present disclosure provides a reproducible, tunable, graphene resonator in an array structure with a plurality of thermal actuators to tune the resonant frequency of the graphene resonator by controlling strain on a graphene sheet in the resonator. Each resonator includes a graphene sheet, capacitive sensors, and flexure beams to provide tunability. The technology described in this disclosure can be integrated into wafer scale processing to greatly increase yield and uniformity. Graphene will be selectively grown via chemical vapor deposition (CVD) on the surface of the devices on the wafer and then the growth metal will be etched away.

A gas sensor according to principles of the present disclosure includes a Graphene sheet. This novel gas sensor uses a resonant element to measure the presence of certain gasses it is exposed to with great precision. Graphene can appear in many different forms i.e. pristine graphene, graphene oxide, reduced graphene oxide, doped graphene etc. For the purposes of this disclosure all different forms will be described generally as "graphene".

Figure 1:
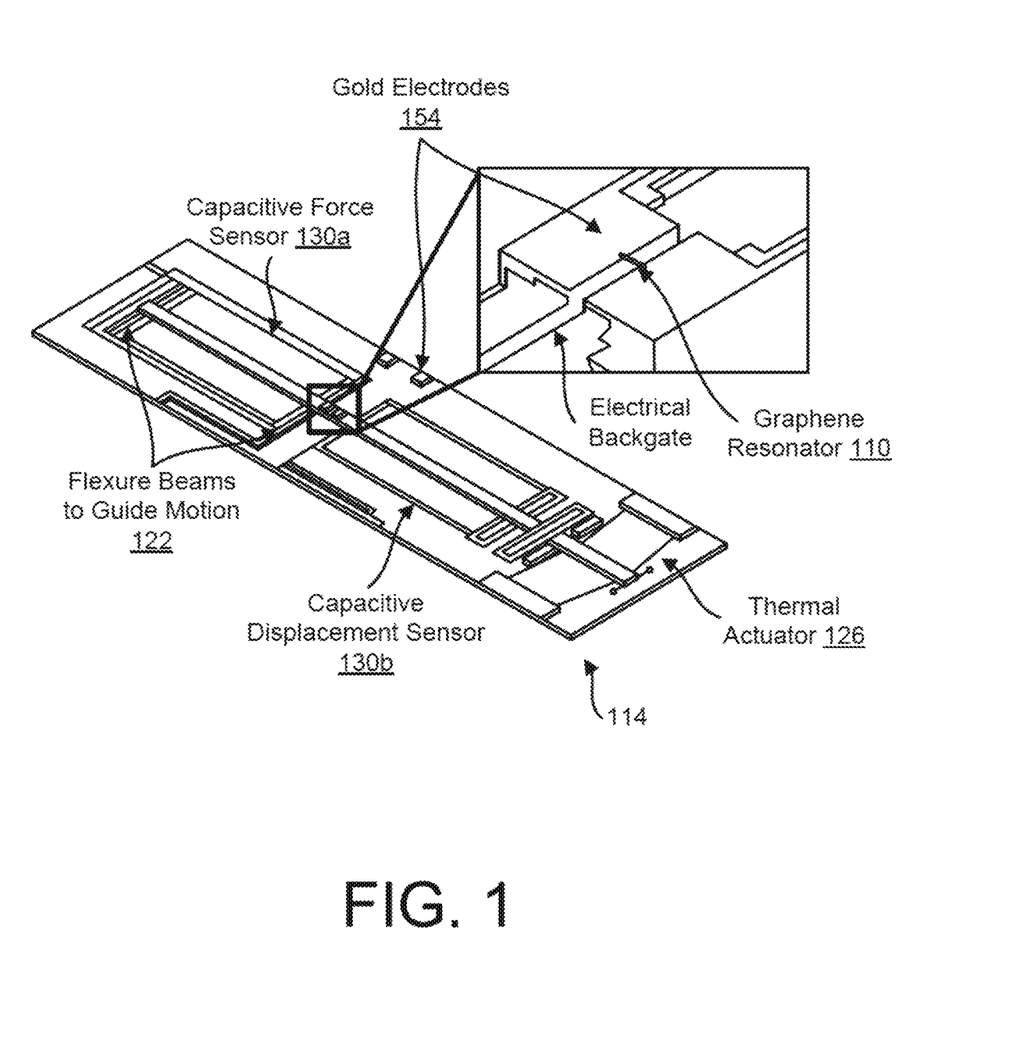
FIG. 1 is an illustration of a MEMS device according to principles of the present disclosure.

As illustrated in FIG. 1, according to principles described herein, a graphene sheet is placed into Microelectromechanical (MEMs) 114 that puts the sheet under tension. The thickness of the graphene sheet 110 may be one atom thick, but may be thicker, for example in the range of 1-3 atoms thick. Two independent stages 118 are used to place positive strain (tension) on the graphene sheet 110 and are meant to negate all induced strain on the graphene sheet 110 from growth and transfer. Once the induced strain is negated, all graphene sheets can have/will have uniform tension stress across them. In order for the gas sensor to be reliable, the inherent strain in the graphene resonant element 110 must be tuned from device to device to allow for a reproducible resonant frequency. This tuning is preformed using the microelectromechanical system (MEMS) 114. The two independent stages 118 are connected to different sets of flextural beams/bearings 122 used to guide the direction of their motion. Between the two stages, graphene sheet 110 is suspended and free to resonate. One of the stages is actuated by a thermal actuator 126 to provide a uniform and constant tension on the graphene sheet 110, taking into account any inherent tension in the graphene 110. How the displacement created in the actuator is translated to strain on the graphene sheet 110 is measured by two differential capacitive sensors 130, one on each stage. These capacitive sensors 130 change capacitance as the stages move and can be translated to strain on the graphene sheet 110. One of the capacitive sensors may be a capacitive force sensor 130a and one may be a capacitive displacement senor 130b, but the configuration is not necessarily limited thereto. An exemplary thermal actuator may be made of doped poly-Si. The exemplary thermal actuator has 20 pairs of beams inclined at 7 degrees. A thickness of 6 um was chosen to have an out of plane stiffness that is a few orders of magnitude larger than in plane. The displacement of the actuator will increase when more beams are added and when inclination angle is decreased. Adding heat sink beams decreases efficiency of the actuator since it adds stiffness, but help to decrease temperature at the stage.

Figure 2:
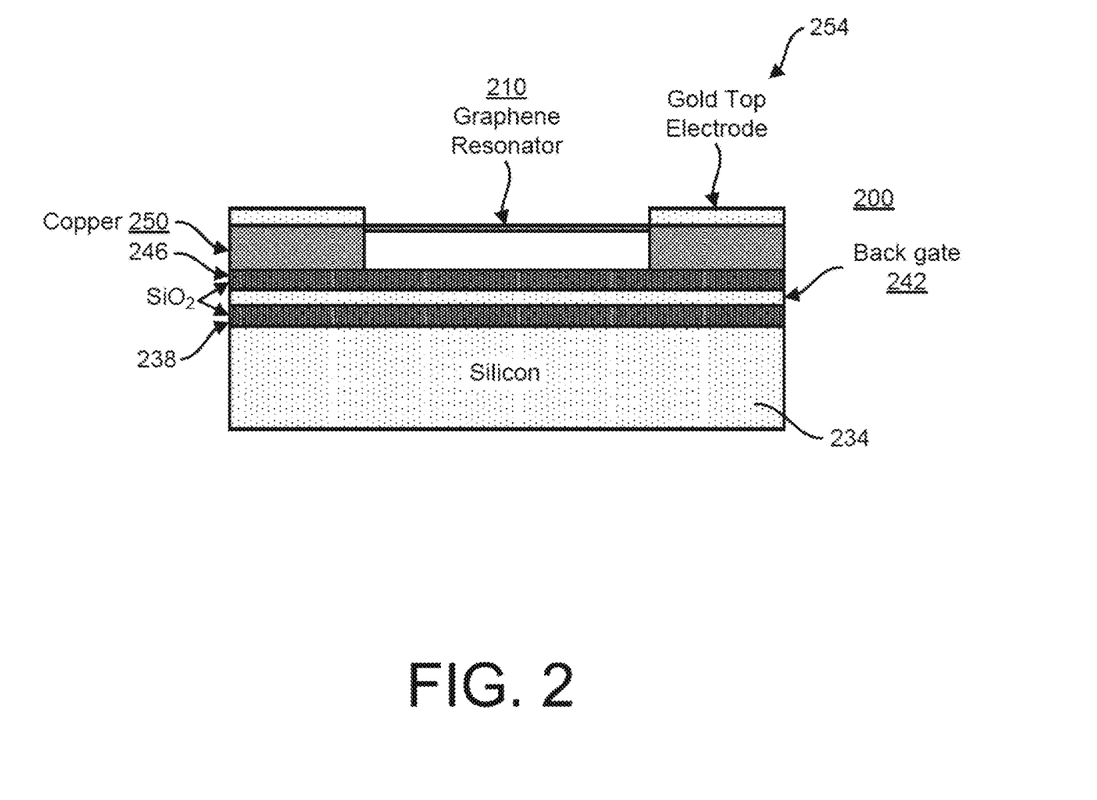
FIG. 2 is an illustration of a MEMS device according to principles of the present disclosure.

An exemplary embodiment of a strain-based tunable graphene NEMS resonator according to principles of the present disclosure is illustrated in FIG. 2. As illustrated in FIG. 2, an exemplary MEMS resonator 200 includes a substrate 234, which may be silicon. A first silicon dioxide (SiO2) layer 238 is formed on the silicon substrate 234. A back gate 242 is formed on the first silicon dioxide layer 238 and a second silicon dioxide (SiO2) layer 246 is formed on the back gate 242. Patterned conductive metal 250, such as copper, is formed on the second silicon dioxide (SiO2) layer 246. At least two top electrodes 254, which may be gold, are formed on the top of the patterned copper 250. A graphene sheet 210 extends between the two top electrodes 254.

Figure 7A:
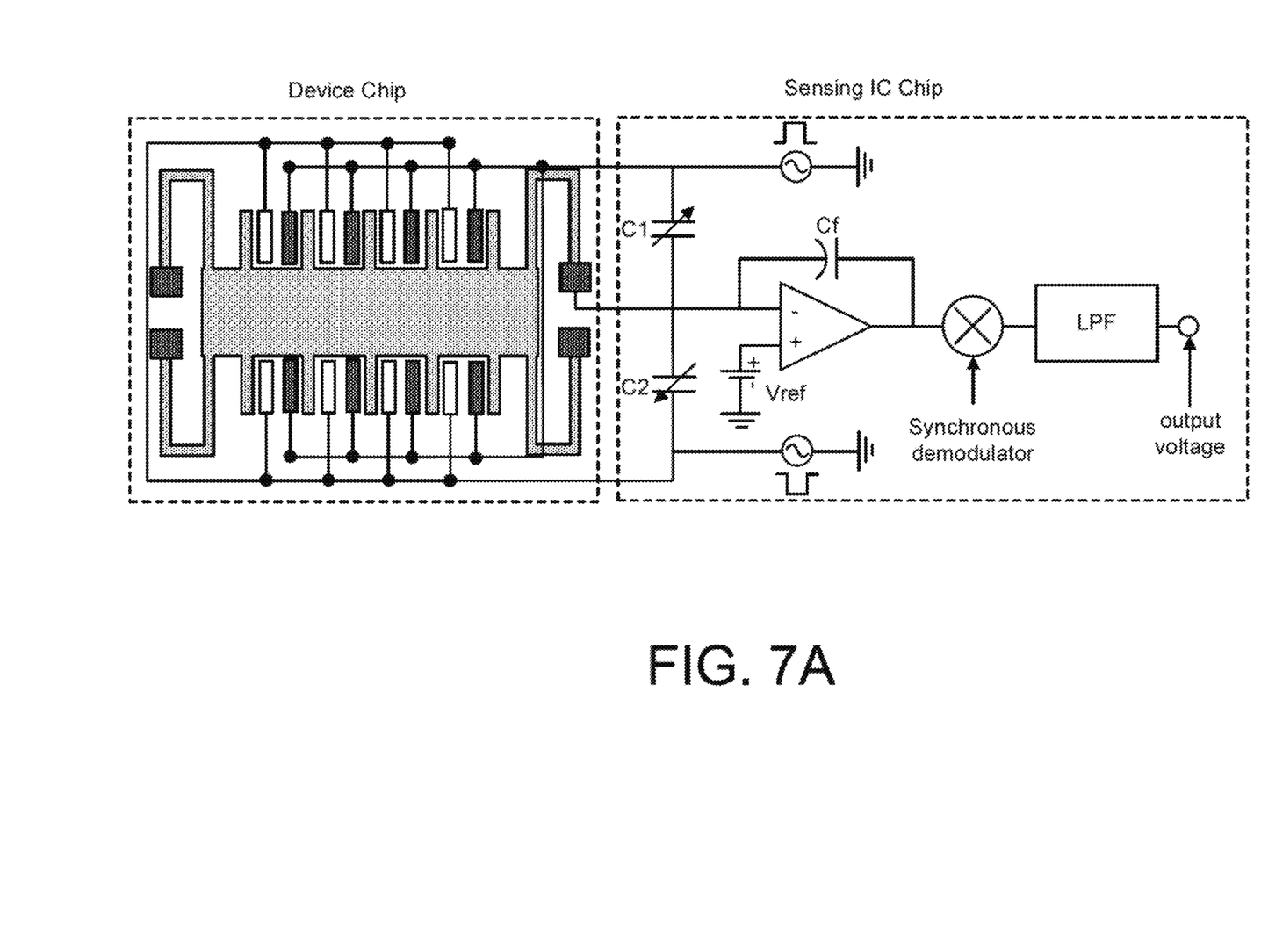
FIG. 7(a) illustrates an exemplary capacitive sensor circuit according to principles of the present disclosure.
Figure 7B:
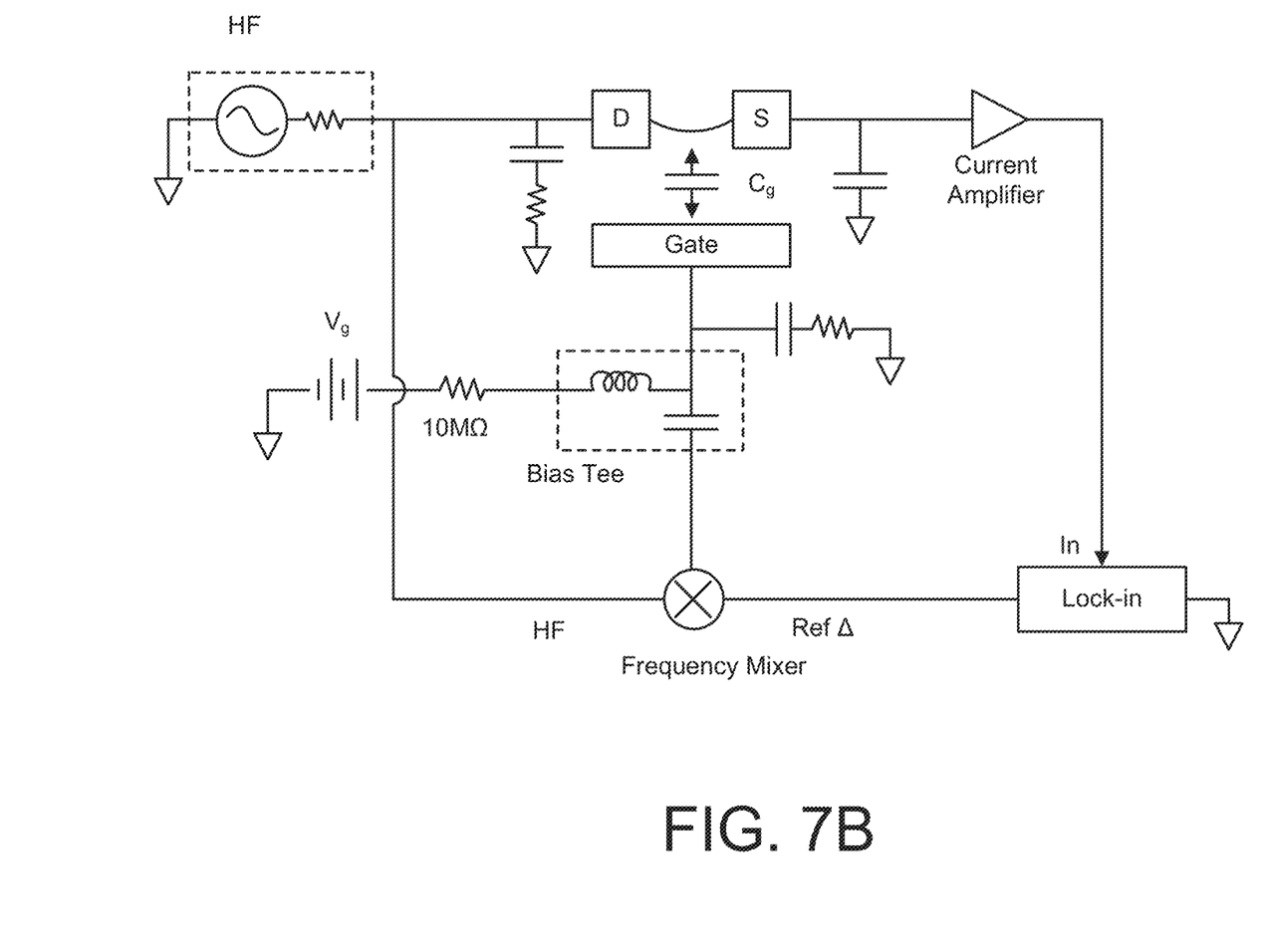
Figure 8:
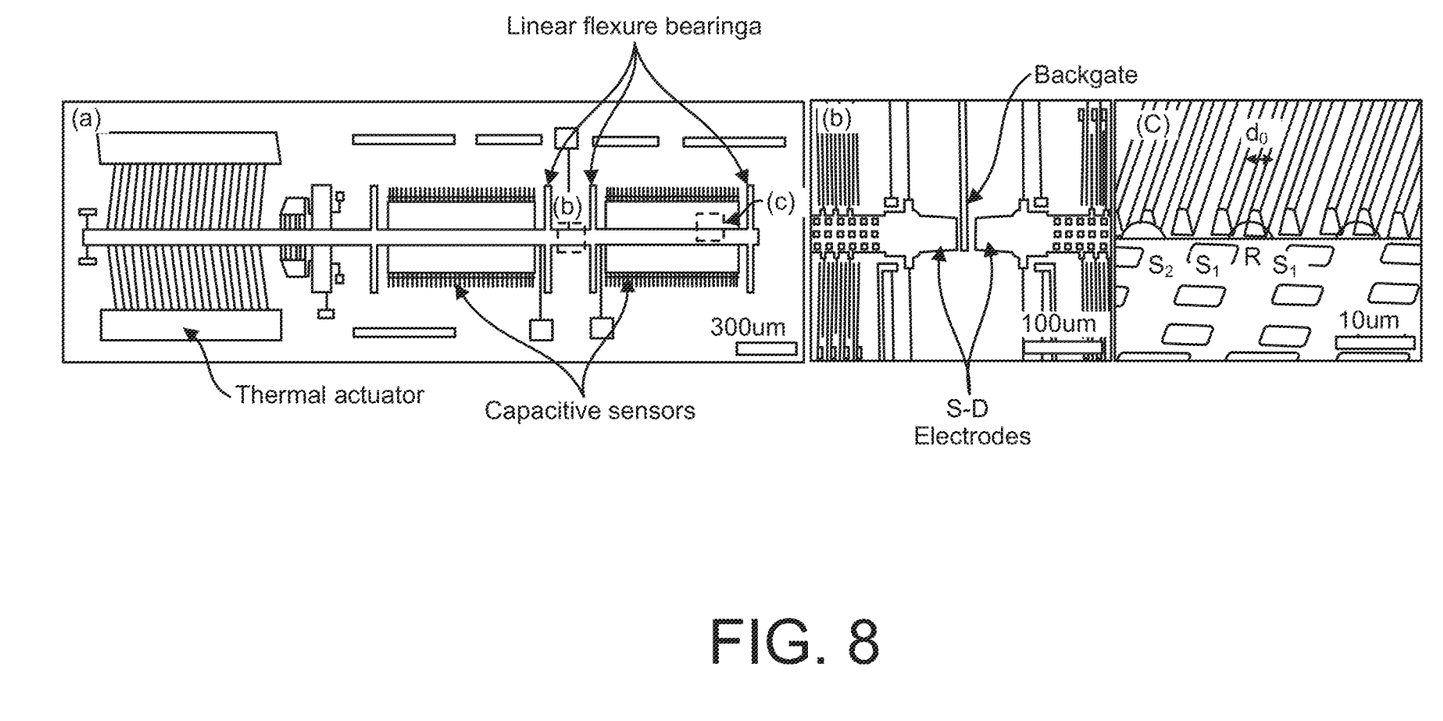
FIG. 8 is a photograph by scanning-electron microscope of features of an exemplary device according to principles of the present disclosure

FIG. 7(a) illustrates an exemplary capacitive sensor circuit according to principles of the present disclosure. FIG. 7 (b) illustrates an exemplary resonance driver circuit according to principles of the present disclosure. Resonant frequency is directly related to the tension in the graphene sheet, according to the following equation:

$$f_{res}(V_g) = \frac{1}{2L}\sqrt{\frac{T_0 + T_e(V_g)}{\rho w}}$$

where,
L: length of the graphene sheet
w: width of the graphene sheet
$\rho$: two dimensional mass density. Sum of the contribution of the graphene and any adsorbates (gas molecules and functionalizing particles)
$T_0$: Built in tension in graphene sheet
$T_e$: electrostatically induced tension
$V_g$: gate voltage To ensure the tension is the same from device to device, the strain must be manipulated. Once the tension stress in graphene from device to device is equal, the resonant frequency will also be equal and reproducible. This manufacturability is the major roadblock in the development of this type of technology and will be solved with this novel device.

Now that the resonant frequency is the same from device to device, it can now be used to sense gasses. Reliable reproducibility of MEMS resonators with the same resonant frequency allows for sensors including multiple MEMS resonators to be manufactured. First the graphene must be doped (functionalized) with different molecules or nanoparticles to selectively bond to the desired gas. When a molecule bonds to the functionalized graphene surface, the mass of the graphene sheet is increased, therefore decreasing the resonant frequency since frequency is inversely related to the square root of the mass. Functionalizing the graphene with different atoms or nanoparticles will decide what gas can be adsorbed to its surface. This method allows for detection of virtually any gas as long as the target gas is known to bond to it.

Once the graphene is functionalized, the desired gas will selectively bond to the active sites on the suspended graphene resonant element. Depending on the concentration of the gas in the atmosphere, there will be either more or fewer gas molecules bonding to the surface. Resonant frequency is inversely related to mass, and as more molecules bond to the graphene surface, the mass will increase, therefore decreasing resonant frequency. The mass of the graphene sheet in relation to the molecules is relatively small, therefore even the smallest change in mass, down to one molecule, can change the resonant frequency and be detected.

Not all devices will require the same strain placed on them since there is variability in the graphene sheets. To ensure the correct strain is placed on each individual device, the device must be excited into resonance. Each system can be excited into resonance through an electrical back gate or other similar electric field propagator. As the AC frequency on the back gate is swept, the conductance across the graphene sheet will change because the distance from the back gate will change. With this change comes a change in the number of charge carriers. When the distance between the graphene and back gate is minimum, the number of charge carriers is maximum, which means the current through the graphene will be maximum as well. In other words, as back gate AC frequency is swept, when the current through the graphene sheet is maximum, the sheet will have reached resonance. FIG. 7 (b) illustrates an exemplary resonance driver circuit to excite the device according to principles of the present disclosure.

Target gas molecules will bond to the functionalized graphene surface. The mass of the graphene is extremely small since it is only 1-3 atomic layers thick, therefore the captured gas molecules will increase the mass of the resonator significantly. This increased mass will directly affect the resonant frequency of the resonator according to the following model:

This same MEMS architecture can be used as a micro scale tensile tester. The material can be fixed to the two opposite stages and then the thermal actuator will exert a force on the material, and the displacement sensed in the capacitive sensors can be translated into a strain on the material. From this, a characteristic stress strain curve can be created for the material.

This graphene resonator could also be used as a resonator for signal processing applications. The tunability of this MEMS device would allow for a large bandwidth of many orders of magnitude due to graphene's ability to strain up to 20% without failing. Many signal processing chips currently rely on bulky quartz oscillators to produce signals at certain bands. It would be possible to consolidate the many different oscillators used into one central graphene resonator, therefore reducing area used on a chip.

This system has the potential to sense single gas molecules that bond to it. Resolution this fine would be important for medical examination of our breath. Certain diseases create waste that is exhaled and if their concentration could be detected, it could be a powerful tool in medical diagnosis.

Highly customizable to the desired gas to be detected. Uses graphene which is the strongest material currently known and the device is tough and reusable. The presently described sensor has the potential to be accurate to parts per billion (ppb).

An advantage of devices according to principles of the present disclosure is that a MEMS resonator can be made in bulk using wafer processing.

Figure 3:
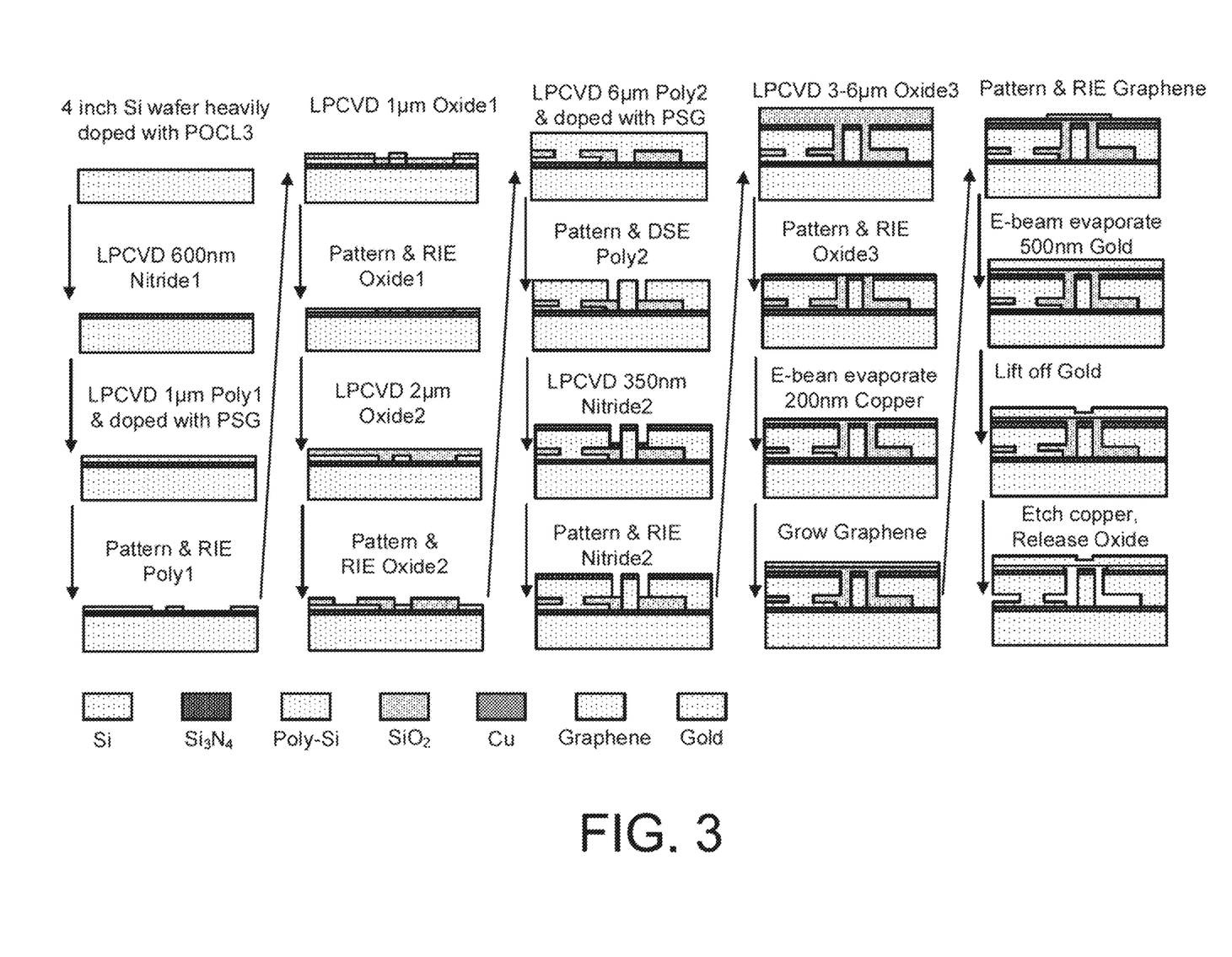
FIG. 3 is an illustration of a manufacturing process for forming a MEMS device according to principles of the present disclosure.

FIG. 3 illustrates one process for making a MEMS devices according to principles of the present disclosure. As illustrated in FIG. 3, a first low stress nitride layer is provided on silicon wafer that is heavily doped with phosphorus oxychloride (POCl3). The first low stress nitride layer may be provided by lower pressure chemical vapor deposition (LPCVD) or other known method. In the illustrated embodiment, the first low stress nitride layer is approximately 600 nm thick. A first polysilicon layer is provided on the on the first low stress nitride layer; in the illustrated embodiment at a thickness of approximately 1 µm. The first polysilicon layer is patterned, for example, by reactive-ion etching (RIE). A first low temperature oxide layer, e.g., SiO2, is provided on the patterned polysilicon layer, by, for example, LPCVD to a thickness of about 1 µm. The first low temperature oxide layer is patterned, for example, by RIE. A second low temperature oxide layer, e.g., SiO2, is provided on the patterned first low temperature oxide layer, by, for example, LPCVD to a thickness of about 2 µm. The second low temperature oxide layer is patterned, by, for example, RIE. A second polysilicon layer is provided on the patterned second low temperature oxide layer and doped with PSG (phosphosilicate glass) or the like. The second polysilicon layer is patterned, by, for example by deep silicon etch (DSE) or the any other appropriate method. A second low stress nitride layer is deposited, by, for example, LPCVD, on the second polysilicon layer to a thickness of approximately 350 nm. The second low stress nitride layer is patterned by, for example, RIE. A third oxide layer, e.g. SiO2, is provided on the second low stress nitride layer, by, for example, LPCVD to a thickness of about 3-6 µm. The third oxide layer is patterned by, for example, RIE. A copper-nickel layer is provided on the third oxide layer, by, for example, electron-beam evaporation to a thickness of approximately 200 nm. Graphene is then grown on the copper-nickel layer and patterned by RIE, for example. Gold is provided on the patterned graphene, by, for example, electron-beam evaporation. The gold is patterned by lift off methods, the copper etched and the oxide released.

In the above described exemplary manufacturing process, monolayer graphene is be grown on the Cu—Ni thin film deposited on an SiO2/Si wafer. The graphene transfer onto the MEMS device is done by wet transfer technique, removing PMMA, patterning a photoresist and evaporating unnecessary graphene.

The second low stress nitride layer may be patterned and on top of the structure of the MEMS device to act as an insulator as well. This layer keeps current leakage at a minimum between the gold electrodes on the stage.

Figure 4A:
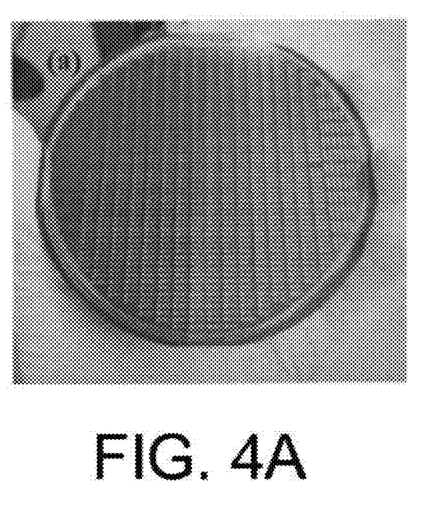
FIG. 4 is a photograph of a wafer processed according to principles of the present disclosures.
Figure 4B:
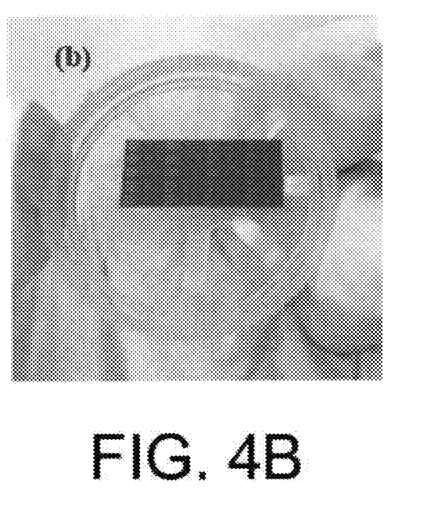

This exemplary manufacturing method results in a silicon wafer of perhaps 4-inch diameter having a plurality of MEMS devices formed thereon, as shown in FIG. 4(a). The wafer may be diced to create an array of sensors on a single chip. A chip having a predetermined number of devices thereon can be used in a sensor. A 4×4 device chip is shown in FIG. 4(b)

Figure 5:
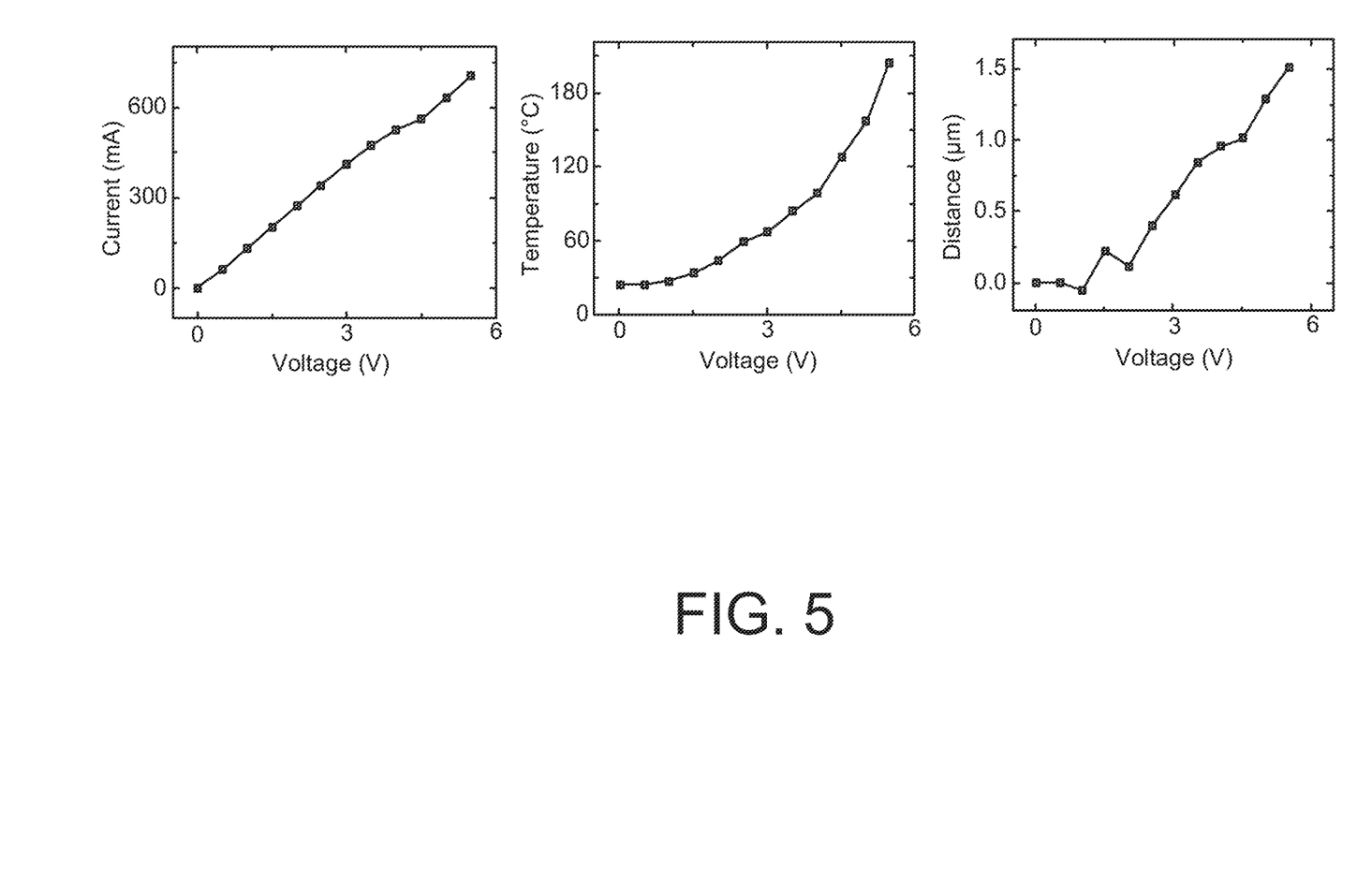
FIG. 5 is a set of response characteristics of an exemplary device according to principles of the present disclosure.
Figure 6:
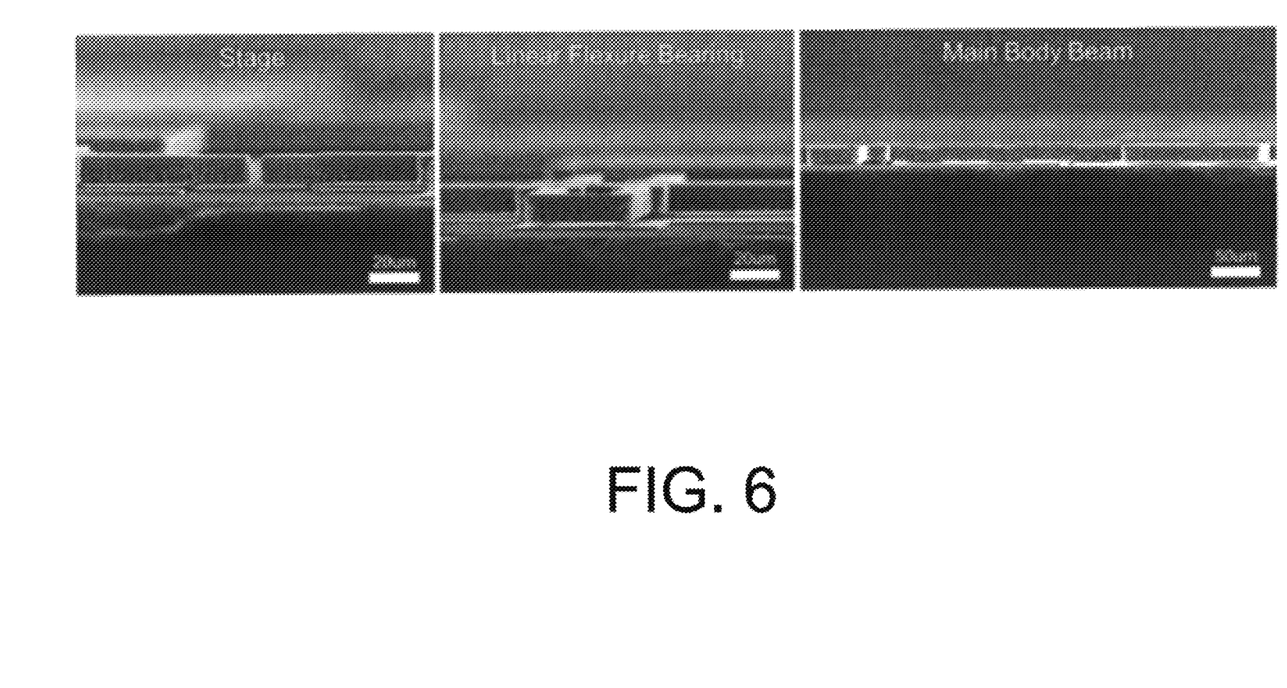
FIG. 6 is a photograph by scanning-electron microscope of features of an exemplary device according to principles of the present disclosure.

A prototype design for 20 graphene resonator MEMS devices with load resolutions ranging from 6.95 nN to 170.43 nN and displacement resolutions of 0.23 nm with 40 unit cells of the 20 designs on a 100 mm wafer each capable of producing large strains of up to 15%-25% in the graphene was manufactured according to principles described herein. Basic tensile tests measuring current vs. voltage, temperature vs. voltage, and displacement v. voltage as illustrated in FIG. 5. Maximum voltage without damaging electrodes was 6-8V and movement was observed by microscope. FIG. 6 shows SEM images of fully released structure taken from close to 90° angle side vie at different locations.

Specific aims: (1) Present designs for 20 graphene resonator MEMS devices with load resolutions ranging from 6.95 nN to 170.43 nN and displacement resolutions of 0.23 nm (2) Establish 40 unit cells of the 20 designs on a 100 mm wafer each capable of producing large strains of up to 15%-25% in the graphene Results: (1) Fabricated (2) Cu—Ni forms perfect alloy during growth (3) Cu—Ni alloy has better thermal stability over pure copper $$\Delta C = \frac{2N\varepsilon A}{d_0^2}\Delta d$$

Where,
N: number of sensors
ε: permittivity
A: area of capacitor
$d_0$: initial displacement
Δd: differential displacement In addition to the aspects described above, additional feature may include the use of a material with a lower surface roughness, which may improve tuning accuracy. This can be done through annealing and pretreatment of the growth substrate or it could be done through a complete change in the growth substrate.

In addition, the graphene sheets may experience weakening because of the doping treatment, which may be improved by using bi or even tri layer graphene, as opposed to perfect monolayer graphene. This would increase stiffness in the thin sheet, but would also create a stronger scaffold for the dopants added.

Resonant sensing has more resolution because the graphene sheet is so light that any small gas molecules that adsorb onto the surface of it will cause a large change in the mass of the sheet. This change is mass will affect resonance greatly.

The MEMS architecture designed to tune the inherent strain in the graphene, and thus its overall tension, is a novel idea that has never been implemented before. This system solves the problem of imprecise, expensive, and exotic gas sensors. Many gas sensors depend on expensive catalytic materials that are hard to manufacture. This device is able to sense countless different species of gas and only need small amounts of nanoparticles bonded to the graphene to function.

The design of a microelectromechanical system (MEMS) uses controllably strained graphene to create repeatable nanoelectromechanical (NEMS) resonators with precise load detection. By accurately controlling the strain on a single layer graphene resonator (GR), it is possible to remove the manufacturing limitation of varying residual stresses and manufacture NEMS resonators that are more accurate, reliable, and repeatable than with current designs and manufacturing techniques This type of resonant sensor has the potential to be more accurate than current technologies and much more customizable. This manufacture method can be used to create many different types of sensors by only changing the material the graphene is doped with.

It will be apparent to those skilled in the art that various modifications and variations can be made in the presently disclosed device and methods without departing from the spirit or scope of the invention. Thus, it is intended that the present invention cover the modifications and variations of this invention provided they come within the scope of the appended claims and their equivalents.

Throughout this application, various publications may have been referenced. The disclosures of these publications in their entireties are hereby incorporated by reference into this application in order to more fully describe the state of the art to which this invention pertains.

Graphene Resonator:

Hone, J., Molnar, A., Lee, C., Lee, S., (2016). U.S. Pat. No. 9,344,127. Washington, D.C.: U.S. Patent and Trademark Office.

Espinosa, H. D., Zhu, Y., & Moldovan, N. (2007). Design and Operation of a MEMS-Based Material Testing System for Nanomechanical Characterization, 16(5), 1219-1231.

Chen, C., Rosenblatt, S., Bolotin, K. I., Kalb, W., Kim, P., Kymissis, I., . . . Hone, J. (2009). Performance of monolayer graphene nanomechanical resonators with electrical readout. *Nature Nanotechnology*, 4(12), 861-867. http://doi.org/10.1038/nnano.2009.267

While various embodiments of the present invention have been described above, it should be understood that they have been presented by way of example only, and not limitation. It will be apparent to persons skilled in the relevant art that various changes in form and detail can be made therein without departing from the spirit and scope of the present invention. Thus, the breadth and scope of the present invention should not be limited by any of the above-described exemplary embodiments, but should be defined only in accordance with the following claims and their equivalents.

What is claimed is:

1. A method of sensing a selected gas, comprising:
providing a resonator having a graphene sheet 1-3 atoms thick, wherein the sheet of graphene has been functionalized to bond to molecules of the selected gas;
tuning a resonant frequency of the graphene sheet; and
detecting change in resonant frequency of the graphene sheet as indication that the selected gas is present.

2. The method of claim 1, wherein the graphene sheet is suspended between a first stage and a second stage and the tuning the resonant frequency comprises adjusting tension on the graphene sheet by moving one of a first stage and the second stage.

3. The method of claim 2, wherein the one of the first stage and the second stage is operatively coupled to a thermal actuator and the adjusting the tension on the graphene sheet comprises activating the thermal actual actuator to cause the one of the first stage and the second stage to move.

4. The method of claim 2, wherein, the first stage and second stage comprise polycrystalline silicon.

5. The method of claim 4, wherein the first stage and second stage further comprise copper on the polycrystalline silicon.

* * * * *